(12) United States Patent
Tada et al.

(10) Patent No.: US 7,968,434 B2
(45) Date of Patent: Jun. 28, 2011

(54) METHOD OF FORMING OF A SEMICONDUCTOR FILM, METHOD OF MANUFACTURE OF A SEMICONDUCTOR DEVICE AND A SEMICONDUCTOR DEVICE

(75) Inventors: Munehiro Tada, Minato-ku (JP); Krishna Saraswat, Stanford, CA (US)

(73) Assignees: NEC Corporation, Tokyo (JP); Stanford University, Palo Alto, CA (US)

( * ) Notice: Subject to any disclaimer, the term of this patent is extended or adjusted under 35 U.S.C. 154(b) by 147 days.

(21) Appl. No.: 12/271,488

(22) Filed: Nov. 14, 2008

(65) Prior Publication Data
US 2010/0123218 A1    May 20, 2010

(51) Int. Cl.
*H01L 21/20* (2006.01)
*H01L 21/36* (2006.01)
(52) U.S. Cl. ......... 438/479; 438/492; 438/503; 438/507
(58) Field of Classification Search ................. 438/479, 438/492, 503, 507
See application file for complete search history.

(56) References Cited

U.S. PATENT DOCUMENTS

| 5,514,879 | A * | 5/1996 | Yamazaki | 257/65 |
| 2002/0006689 | A1* | 1/2002 | Miyasaka | 438/149 |
| 2010/0055880 | A1* | 3/2010 | Tillack et al. | 438/478 |

* cited by examiner

*Primary Examiner* — Kevin M Picardat
*Assistant Examiner* — Bac H Au
(74) *Attorney, Agent, or Firm* — Sughrue Mion, PLLC

(57) ABSTRACT

This invention provides a method of forming semiconductor films on dielectrics at temperatures below 400° C. Semiconductor films are required for thin film transistors (TFTs), on-chip sensors, on-chip micro-electromechanical systems (MEMS) and monolithic 3D-integrated circuits. For these applications, it is advantageous to form the semiconductor films below 400° C. because higher temperatures are likely to destroy any underlying devices and/or substrates. This invention successfully achieves low temperature growth of germanium films using diboran. First, diboran gas is supplied into a reaction chamber at a temperature below 400° C. The diboran decomposes itself at the given temperature and decomposed boron is attached to the surface of a dielectric, for e.g., $SiO_2$, forming a nucleation site and/or a seed layer. Second, source gases for semiconductor film formation, for e.g., $SiH_4$, $GeH_4$, etc., are supplied into the chamber, thereby forming a semiconductor film.

8 Claims, 8 Drawing Sheets as deposited

# METHOD OF FORMING OF A SEMICONDUCTOR FILM, METHOD OF MANUFACTURE OF A SEMICONDUCTOR DEVICE AND A SEMICONDUCTOR DEVICE

TECHNICAL FIELD

Apparatuses and methods consistent with the present invention relate to a method of forming a semiconductor film, method of manufacture of a semiconductor device, and the semiconductor device. The semiconductor device preferably has a germanium film on an insulating film, and more preferably has an insertion layer of boron or boron-doped Si between the germanium film and the insulating film.

BACKGROUND

As the size of devices scale down in modern Integrated Circuits (ICs), although transistor speeds improve, the number and the length of the interconnects increases. As a result, a performance bottleneck occurs in the interconnects, which negatively affects device performance. In addition, decreasing the size of the devices dramatically increases power dissipation stemming from both the larger number of interconnects and the degrading device power for a given performance. Three-dimensional integrated circuits (3D ICs) and germanium (Ge), which has a higher mobility than silicon (Si), are considered promising architecture-level and device-level solutions to alleviate large delay and power dissipation problems arising from interconnects and transistors, respectively. 3D integration allows for longer interconnects, which in turn improves both speed and power dissipation in the wires by reducing their capacitance. In addition, 3D-ICs serve as an ideal medium for integration of heterogeneous and disparate technologies such as, radiofrequency (RF), memory, logic, optical devices, thin film transistors (TFT), on-chip sensor, and on-chip micro-electromechanical systems (MEMS).

There are several types of 3D-ICs differentiated primarily by the degree of vertical interconnectivity. They include: 1) package level stacking and connections such as for cell-phone memories (limited to peripheral connections), 2) wafer-to-wafer or die to wafer bonding requiring through-via holes, and finally 3) monolithic 3D-ICs, which exhibit a bottom-up manufacturing of 3D layers, and potentially have the highest (gate-level) vertical interconnectivity. Although monolithic 3D-ICs possess maximum benefits, their fabrication is challenging. It requires low temperature processes preferably under 400° C. in order to preserve underlying layers. These layers consist of both an interconnect stack with fragile, porous low dielectric constant (K) materials and metals, as well as device layers, whose parameters, such as junction depths, have to be tightly controlled to enhance performance by limiting the thermal budget. Ge is an ideal substrate for 3-D ICs, having advantageous characteristics pertaining to both fabrication and performance. First, Ge has a lower melting point than Si, and therefore, it is conducive to low temperature processing. Second, it possesses a higher mobility than silicon, potentially leading to a better power-performance trade-off.

Illustrative, non-limiting embodiments of the present invention overcome the above disadvantages and other disadvantages not described above. Also, the present invention is not required to overcome the disadvantages described above, and an illustrative, non-limiting embodiment of the present invention may not overcome any of the problems described above.

SUMMARY OF THE INVENTION

The inventors of the present invention examined methods for forming semiconductor films and as a result, have found novel methods for forming semiconductor films. The critical bottleneck in device performance, as discussed previously, before implementation of monolithic 3D integration using Ge arises because of a lack of techniques to grow a Ge film with activate dopants below 350° C. Specifically, it is possible to form a germanium film on an insulating film at low temperature below 400° C. to ensure the smooth surface roughness and high adhesion by using the following method. A method of forming a semiconductor film on an insulating film, which is formed on a semiconductor or an insulating substrate, includes supplying a diboran gas or a diboran/silane mixed gas into a reaction chamber before forming the semiconductor film, and the semiconductor film is mainly composed of germanium.

In order to control the conditions within the reaction chamber, the diboran gas or diboran/silane mixed gas is diluted with hydrogen. In order to obtain a smooth Ge surface, the product of time of exposure and partial pressure of the diboran gas or diboran/silane mixed gas is maintained at more than 400 mTorr·min during the deposition process. Under this condition, the inventors have found that the surface of the insulating film is sufficiently covered by a boron layer or a boron-doped Si layer which is required for the uniform growth of germanium. Furthermore, the insulating film, which is deposited below 400° C., is useful for improving the adhesion because the low temperature deposited insulating film has many more dangling bonds than an insulating layer deposited at high temperature. Dangling bonds at the surface of the insulating film enhance the adhesion to the insertion layer, and therefore insulating films deposited at lower temperatures provide better adhesion.

A method of manufacturing the semiconductor film includes the following sequential steps:
(i) heating a substrate to a first temperature;
(ii) supplying the diborane or diboran/silane mixed gas into the reaction chamber; and
(iii) supplying a $GeH_4$ containing gas into the reaction chamber.

For the further improvement of surface roughness, a $SiH_4$ gas is supplied to the reaction chamber between process steps (ii) and (iii), and/or the temperature of the substrate is established at a second temperature without supplying the reaction gases into the reaction chamber between process steps (ii) and (iii), and the first temperature is higher than the second temperature, and the first temperature is preferably 350° C.

Using the above invention, the inventers have also found that the dopants for such as phosphorus, boron and antimony are in-situ activated in the germanium below 400° C. Therefore, the method of forming a semiconductor film described above contains at least one of $PH_3$, $B_2H_6$ or $AsH_3$ mixed with $GeH_4$ in step (iii).

The structure of a semiconductor device having a semiconductor film composed of germanium on a insulating film is characterized in that a layer composed of boron is inserted between the semiconductor film and the insulating film, the thickness of the insertion layer is at least 2 nm, and the semiconductor film includes at least phosphorous, boron or antimony. The semiconductor device is further characterized in that the semiconductor film is polycrystalline Ge (220), which is of higher orientation than Ge (111).

By using this invention, semiconductor films are successfully deposited on the insulating film below 400° C., especially from 250° C. to 350° C. The following application is achieved using low temperature processing, and the semiconductor film thus obtained is used for a gate electrode and an electron channel. The LPCVD deposition of the electrode is especially useful for forming gate electrodes in finFETs and/or gate-all-around type transistors since the LPCVD film grow on the uneven channel structure. The basic structure of a FinFET is published in "Y-K. Choi, T.-J. King, and C. Hu, "Nanoscale CMOS Spacer FinFET for the Terabit Era," *IEEE Trans. Electron Devices*, vol. 23, no. 1 pp. 25-27, 2002." The device is formed on a thin silicon on insulator (SOI) finger, termed a fin. The gates are formed at the vertical sides of the fin using a thin gate oxide layer. Therefore, the conformal deposition on the top and the sidewall is needed for the gate material. Gate work-function tailoring is also essential to adjust the threshold voltage. The work-function is also controlled by changing the pretreatment condition (boron-layer thickness and seed composition) and/or doping concentration in the poly-Ge gate electrode. The geometrical channel width is given by 2×Tfin (height of the fin) or one fin since both channels have to be taken into account. To obtain higher drive currents additional fins must be applied in parallel.

The semiconductor device is formed on multilevel interconnects and at least one layer of interconnects is formed on the semiconductor device. The semiconductor film is used for a transfer gate (pass transistor), a cell of flash memory, or an optical detector. The semiconductor film of the present application may also be is used for a mechanical part.

BRIEF DESCRIPTION OF THE DRAWINGS

The aspects of the present invention will become more apparent by describing in detail illustrative, non-limiting embodiments thereof with reference to the accompanying drawings, in which.

DETAILED DESCRIPTION OF EXEMPLARY EMBODIMENTS OF THE INVENTION

Advantages and features of the present invention and methods of accomplishing the same may be understood more readily by reference to the following detailed description of the exemplary embodiments and the accompanying drawings. The present invention may, however, be embodied in many different forms and should not be construed as being limited to the exemplary embodiments set forth herein. Rather, these exemplary embodiments are provided so that this disclosure will be thorough and complete and will fully convey the concept of the invention to those skilled in the art, and the present invention will only be defined by the appended claims.

First Embodiment

Figure 1:
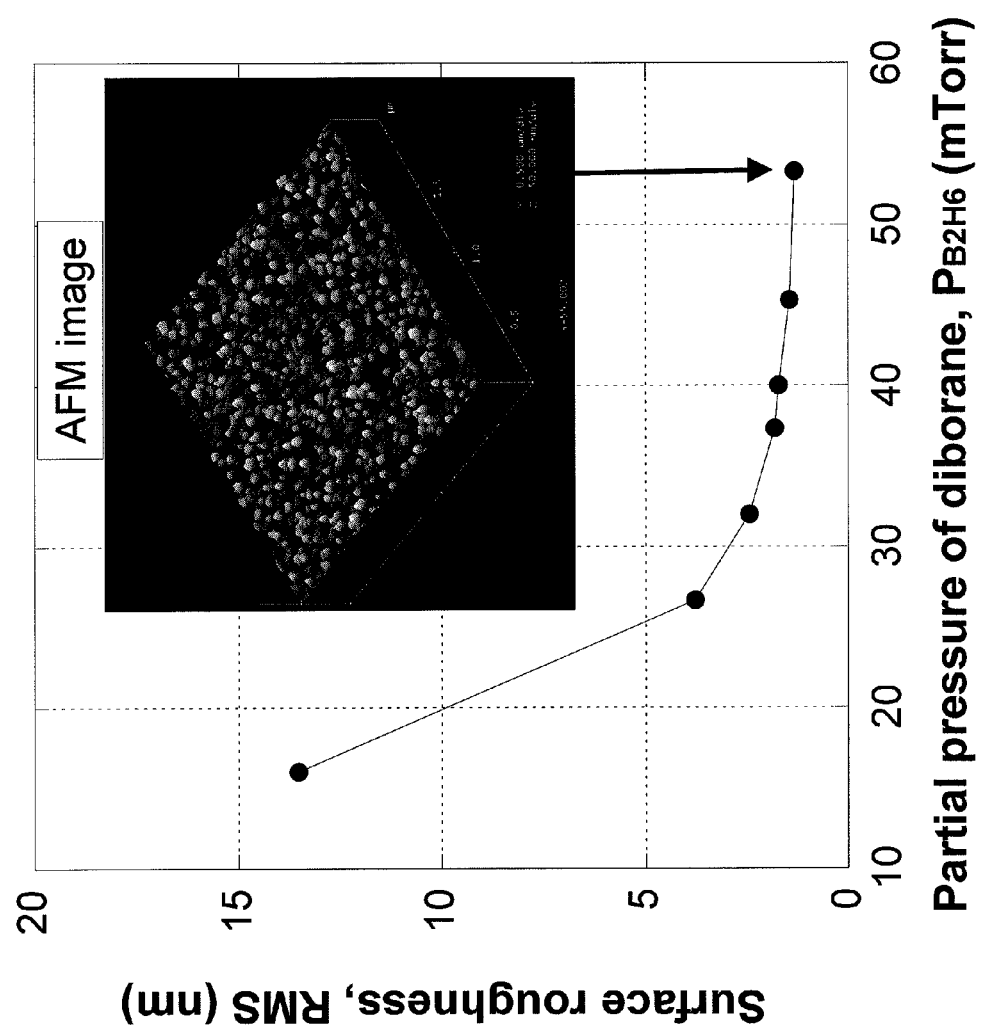
FIG. 1 demonstrates the relationship between surface roughness of a germanium film and the partial pressure of diborane, as observed using atomic force microscopy.
Figure 2:
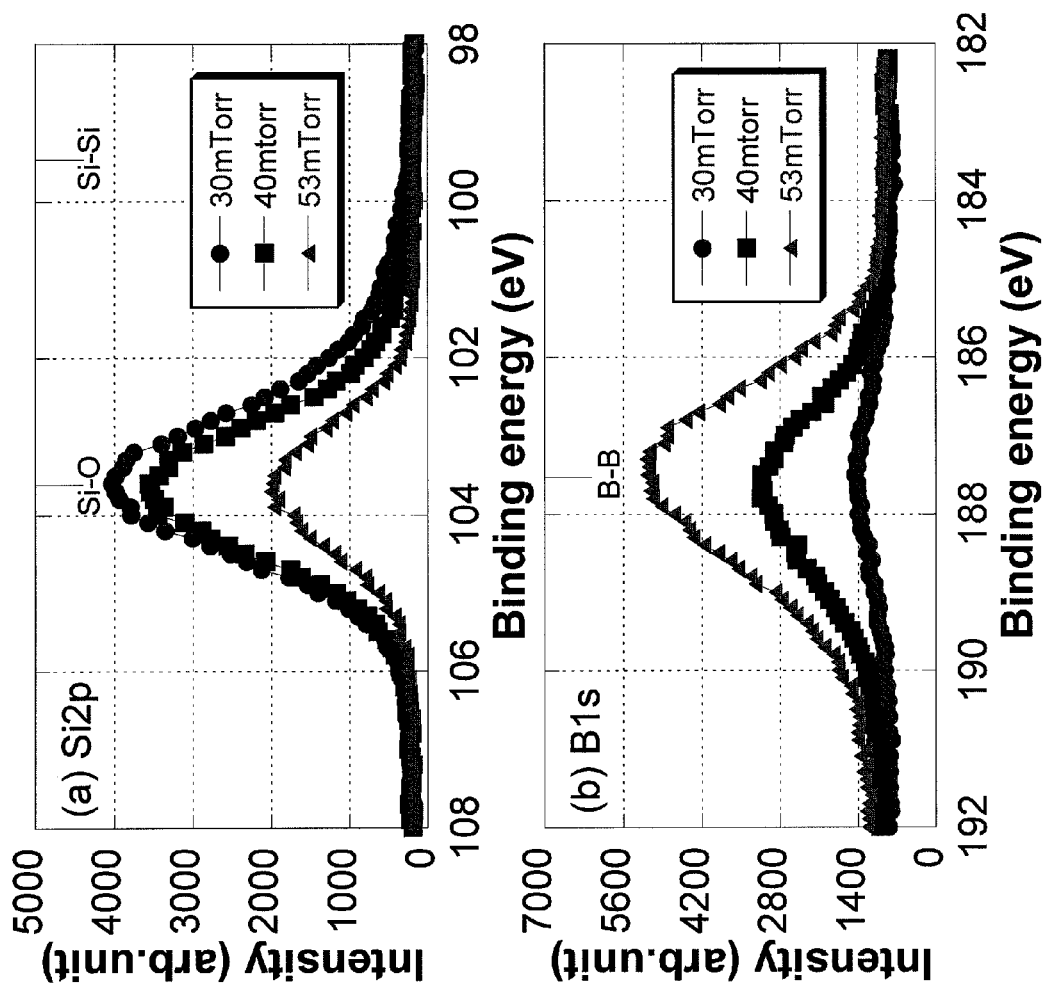
FIG. 2(a) is a high resolution Si(2p) scan of a germanium film after treatment with diboran, analyzed using high resolution X-ray photoelectron spectroscopy.
FIG. 2(b) is a high resolution B(1s) scan of a germanium film after treatment with diboran/SiH$_4$ mixed gas, analyzed using high resolution X-ray photoelectron spectroscopy.

The starting substrates were Si wafers (n-type, 5-10 Ω·cm) with 200 nm silicon dioxide (SiO$_2$) grown by wet thermal oxidation. The wafers were cleaned in 4:1 H$_2$SO$_4$:H$_2$O$_2$ at 90° C. for 10 min and 5:1:1 H$_2$O:HCl:H$_2$O$_2$ at 70° C. for 10 min, followed by rinsing with deionized water and drying in N$_2$ gas. The Ge film was deposited in an LPCVD epi chamber (for example, an Applied Materials Epi Centura™) using pure GeH$_4$ gases. Hydrogen gas of 6 slpm (standard liters per minute) was used as a carrier gas. Depositions were performed at constant temperatures between 300° C. and 550° C. Before the Ge deposition, a diborane gas diluted to 1% by hydrogen was fed into the reaction chamber at a temperature of 350° C. for 1 min., and then changing the substrate temperature to 310° C. in order to grow the germanium film with smooth surface roughness. After the specified temperature was reached, GeH$_4$ gas was carried into the chamber and a germanium film was deposited onto the SiO$_2$ substrate. FIG. 1 represents the surface roughness of germanium film as a function of the partial pressure of diborane, demonstrating that higher partial pressure makes the surface smoother. FIG. 2 represents the surface compositional analysis after the diborane pretreatment, analyzed using X-ray photoelectron spectroscopy. The boron peak at the SiO$_2$ surface is increased and the Si peak (Si—O) is decreased. This means that the surface of the SiO$_2$ substrate is covered by boron, and the thickness of the boron layer increases with increasing partial pressure of diboran. The inventors found that by changing the diboran pretreatment time the surface roughness is affected by both the pretreatment time and the partial pressure of diborane. The best product of a time and a partial pressure of the diboran gas or diboran/silane mixed gas is proposed to be more than 40 mTorr·min. By treating the substrate with 150 sccm diborane diluted by 6 slpm hydrogen for 1 min at 200 Torr, a 2 nm boron layer is grown on SiO$_2$, which is confirmed by a cross sectional TEM observation. This boron layer is stable during the following processes since the melting point of boron is over 2000° C.

The inventors compared three different $SiO_2$ films deposited at 300° C., 400° C. and 850° C., respectively. The films deposited at 300° C. and 400° C. were fabricated using LPCVD and the film deposited at 850° C. by fabricated using wet thermal oxidation of the Silicon substrate. The adhesion of germanium film was evaluated using a peeling test The peeling test was done by using scotch tape (for example, Sumitomo 3M) and a film scribed into 1 $mm^2$ sections. The number of peeled sections and the corresponding peeled percentage was calculated. The Ge films formed on the $SiO_2$ films deposited at 300° C. and 400° C. were not peeled by the scotch tape test, but 1% of the germanium film formed on the $SiO_2$ deposited at 850° C. is delaminated. The adhesion of the germanium film depends on the nature of the insulating film on which the Ge film is grown, and preferably, dangling bonds at the surface of the insulating film enhance the adhesion to the insertion layer.

Figure 3:
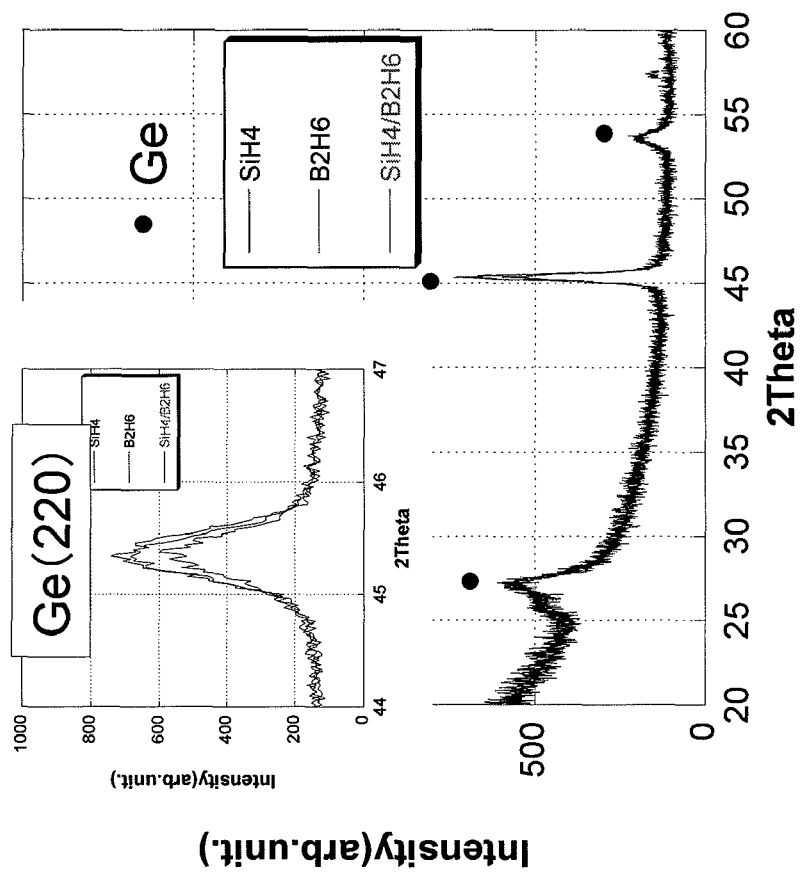
FIG. 3 is X-Ray diffraction data demonstrating the orientation of the germanium film.

The deposited germanium film was further characterized by X-Ray diffraction (XRD). FIG. 3 shows the 2θ-θ XRD spectra using Cu Kα (Cu Kα, λ=1.5408 Å). The germanium film is crystallized in-situ in a cubic phase and has a (220) orientation, and not a (111) orientation. The higher orientation of the germanium film is useful for applications as transistor channels.

Second Embodiment $Si_2H_6$ is well known as a precursor for deposition of poly-Si at low temperatures below 550° C. since $Si_2H_6$ is easily decomposed lower temperature than $SiH_4$. However, $Si_2H_6$ is more expensive and hazardous than $SiH_4$. In addition, it is very difficult to obtain a smooth poly-Si surface since the deposition control is more difficult than $SiH_4$. Therefore, it is desirable to obtain a seed with a smooth surface without using $Si_2H_6$ source gas. In this second embodiment, the inventors disclose the formation method of poly-Si using diborane and silane mixed gas source without using $Si_2H_6$.

The starting substrates were the same as in the first embodiment. Depositions were performed at a constant temperature of 350° C. Before the Ge deposition, a mixture gas composed of a diborane gas diluted to 1% by hydrogen and pure silane was fed into the reaction chamber at a temperature of 350° C. for 1 min, and then changing the substrate temperature to 310° C. in order to grow a germanium film with smooth surface roughness. The mixture ratio of diborane and silane is changed from 0.025 to 1.

Figure 4:
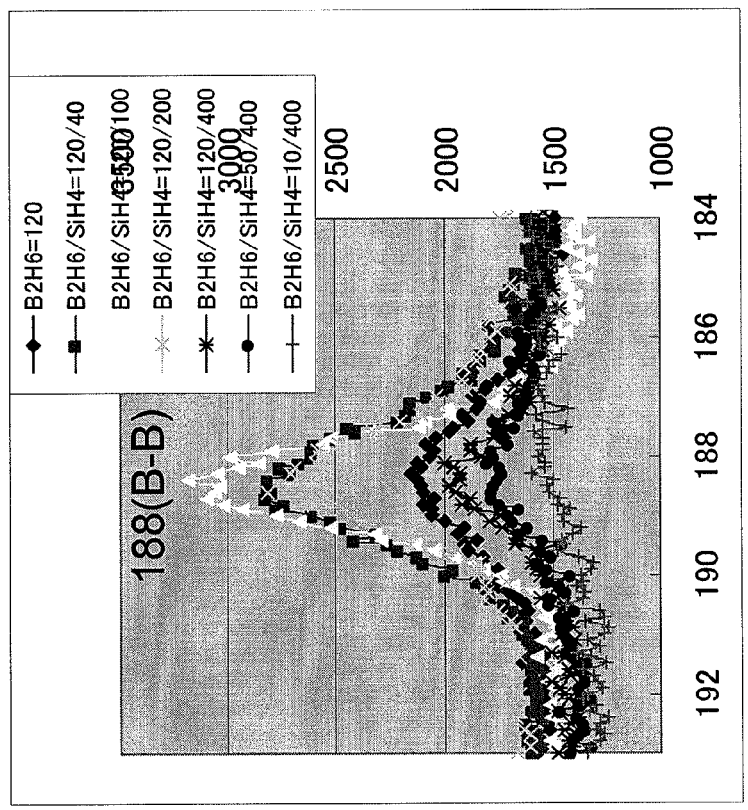
FIG. 4(a) is a high resolution Si(2p) scan of a germanium film after treatment with diboran/SiH$_4$ mixed gas, analyzed using high resolution X-ray photoelectron spectroscopy.
FIG. 4(b) is a high resolution B(1s) scan of a germanium film after treatment with diboran/SiH$_4$ mixed gas, analyzed using high resolution X-ray photoelectron spectroscopy.
Figure 4:
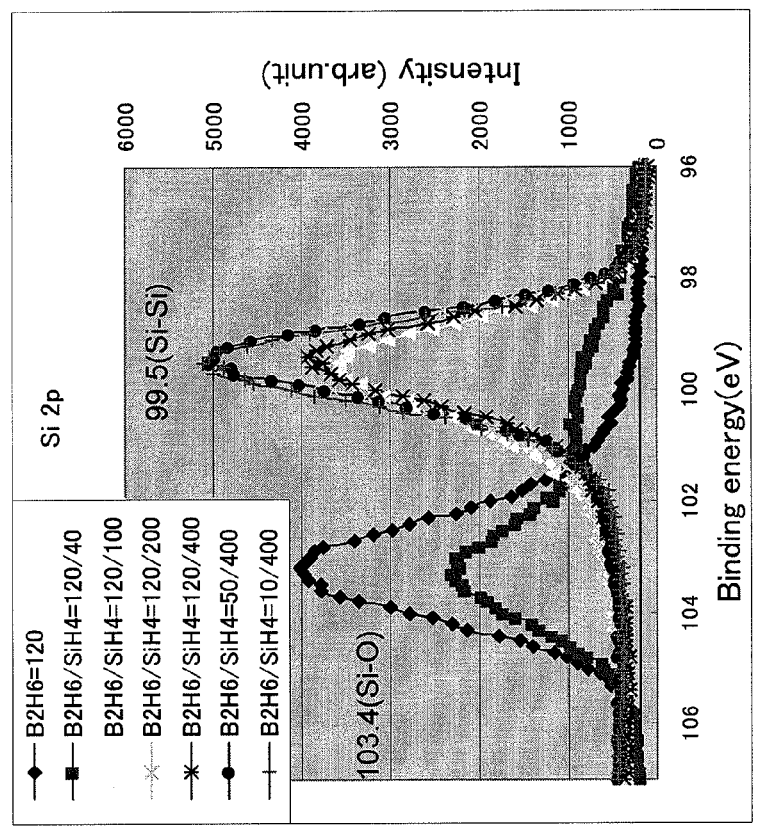

FIG. 4 represents the surface compositional analysis after the pretreatment, analyzed using X-ray photoelectron spectroscopy. The silicon peak at the $SiO_2$ surface is increased and the Si peak (Si—O) is decreased with increasing silane ratio. This means that the surface of the $SiO_2$ substrate is covered by silicon, and the thickness of the boron doped silicon layer increases with increasing partial pressure of silicon.

Figure 5:
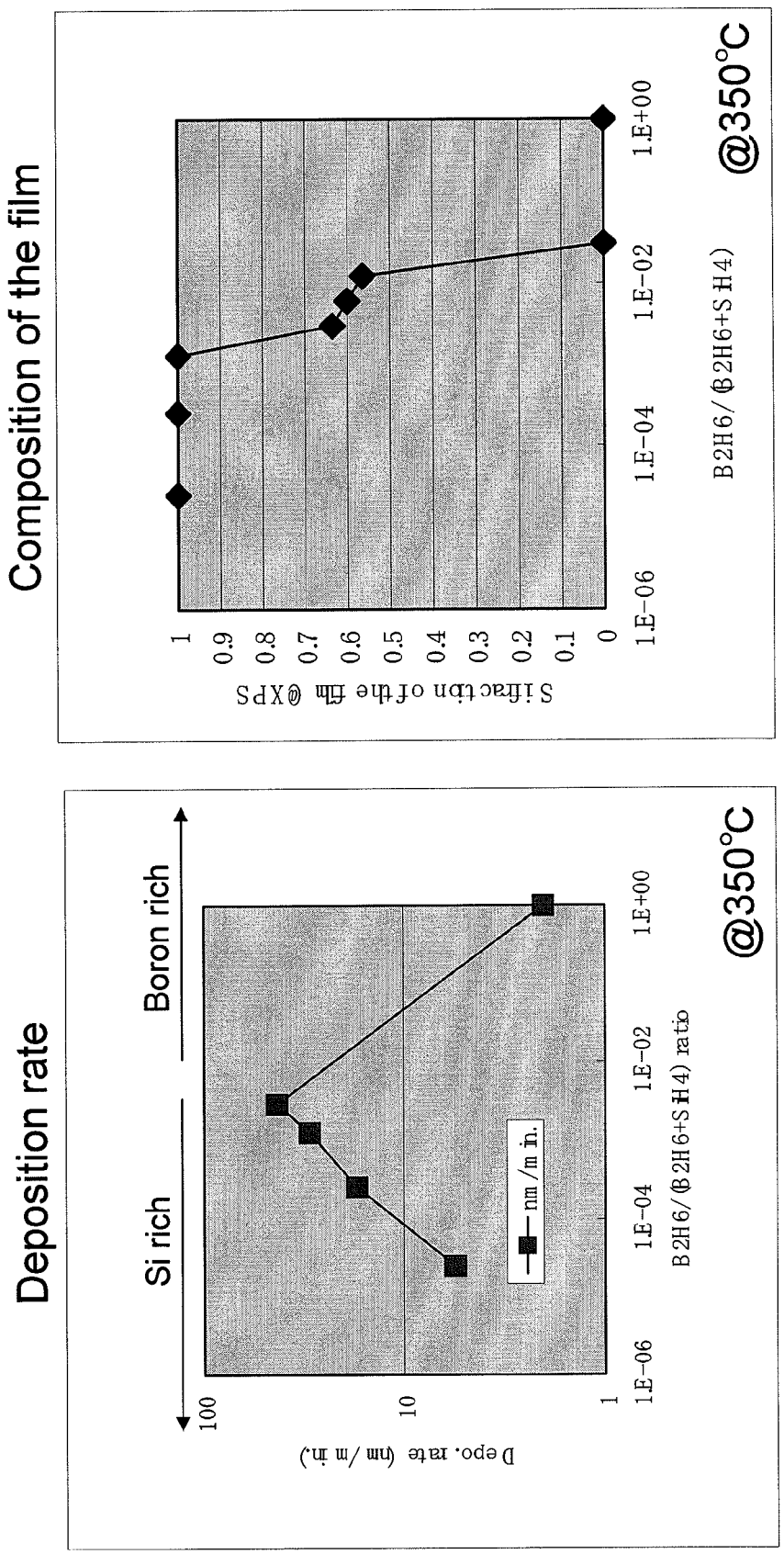
FIG. 5(a) shows the deposition rate of the seed layer as a function of the diborane and silane mixture ratio of the source gas.
FIG. 5(b) is a graph showing the fraction of the silicon as a fraction of diborane and diboran/SiH$_4$ mixed gas used during surface treatment. The analysis was carried out using X-ray photoelectron spectroscopy.

FIG. 5 shows (a) deposition rate and (b) composition of the seed layer. By increasing the boron ratio in the source gas, the deposition rate increases and further increments of diborane decrease the deposition rate. When the mixture ratio reaches 0.025, boron is not detected by XPS, meaning that the film is almost composed of silicon. After seed deposition, the substrate temperature starts to change.

After the specified temperature was reached, $GeH_4$ gas was carried into the chamber and a germanium film was deposited onto the $SiO_2$ substrate. The inventors found that by changing the diboran and silane ratio in the pretreatment gas, the surface roughness of the Ge film can be adjusted on the dielectric substrate.

Third Embodiment

Figure 6:
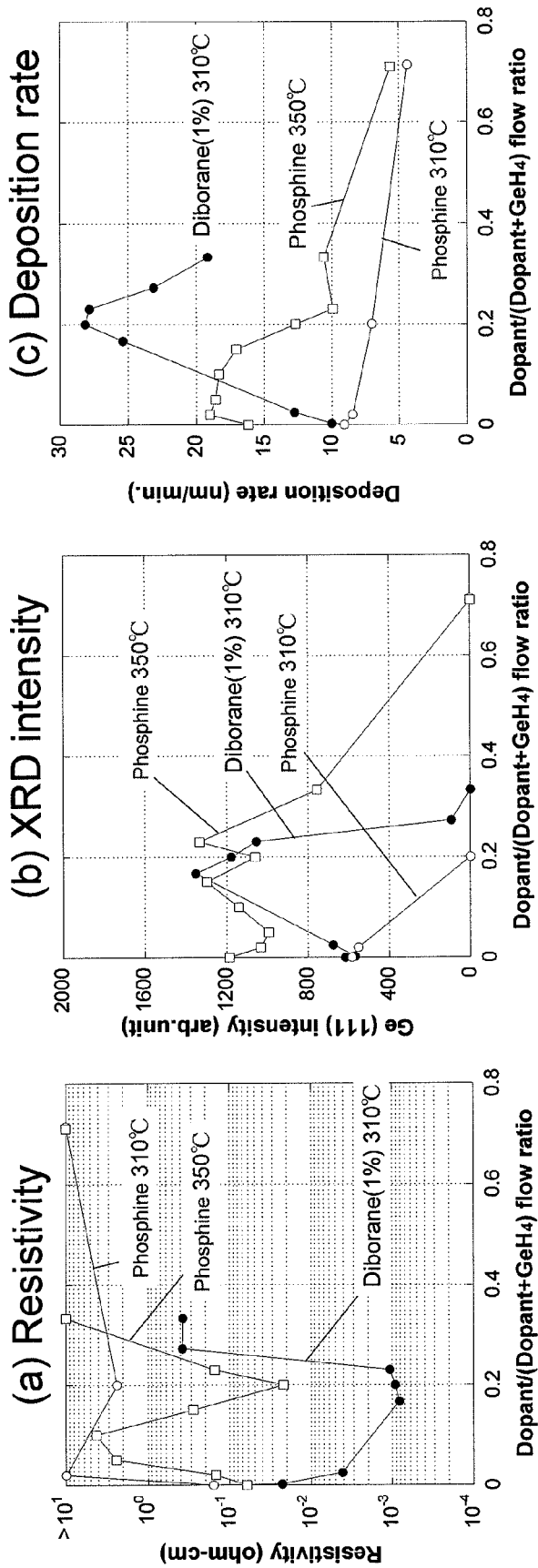
FIG. 6(a) shows the film resistivity of boron and phosphorus in-situ doped Ge films.
FIG. 6(b) is X-ray diffraction data demonstrating the intensity of Ge(111).
FIG. 6(c) is film deposition rate of boron and phosphorus in-situ doped Ge films.

Boron and phosphorous are in-situ doped using $B_2H_6$ and $PH_3$ during the Ge film growth and activated at 310° C. and 350° C. FIG. 6 represents (a) film resistivity, (b) Ge(111) intensity measured by XRD, and (c) film deposition rate. By increasing the dopants flow ratio, the resistivity of the poly-Ge film decreases and significantly low resistivity of ~1 mΩ·cm is obtained around the 0.2 diborane ratio. The crystalinity of Ge (111) and deposition rate also depend on the diborane flow ratio and excess doping makes the phase amorphous, resulting in high resistivity. In contrast, phosphorous is not sufficiently activated at 310° C. due to poor crystallization. A higher temperature above 350° C. is needed for activating phosphorous. The appropriate dopings of boron or phosphorous accelerate the deposition rate as well as improves the crystalinity of Ge, achieving the proper activations of the dopants at temperatures below 350° C.

The following application is achieved using this low temperature processing, and the semiconductor film thus obtained is used for a gate electrode and an electron channel. Especially for the gate electrode application, the LPCVD conformal deposition of the electrode is useful on finFETs and/or gate-all-around type transistors, and work function of the gate electrode can be adjusted by changing the dopant concentration in the Ge film as well as in the seed layer.

Fourth Embodiment

Here, we select the heavily boron doped Ge film (~1 mΩ·cm) for a p-type gate electrode and demonstrate the in-situ dopants activation in low temperature transistor technology.

Figure 7:
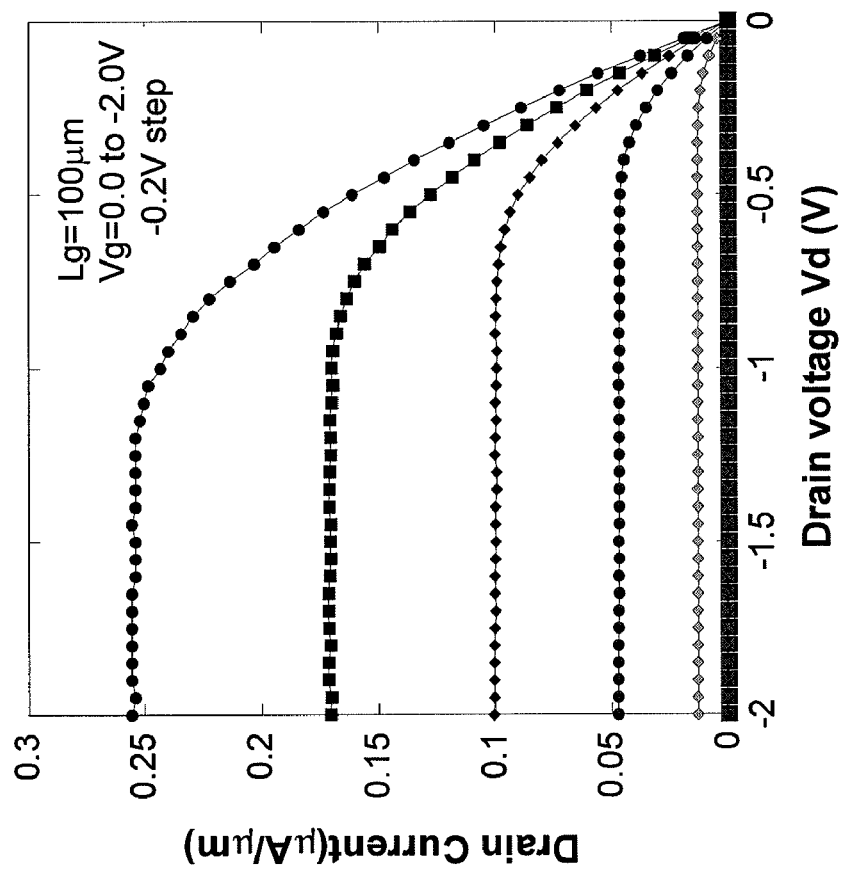
FIG. 7(a) shows the Id-Vg curves for a boron doped Ge film.
FIG. 7(b) is $I_d$-$V_g$ curves of a Si p-type MOSFET with 200 nm of poly-Ge gate electrode, PtSi source/drain, 8.3 nm of SPA gate-oxide and $I_{off}$ below 10-14 A/μm, measured at $V_d$=−0.05 and −1.0V.
Figure 7:
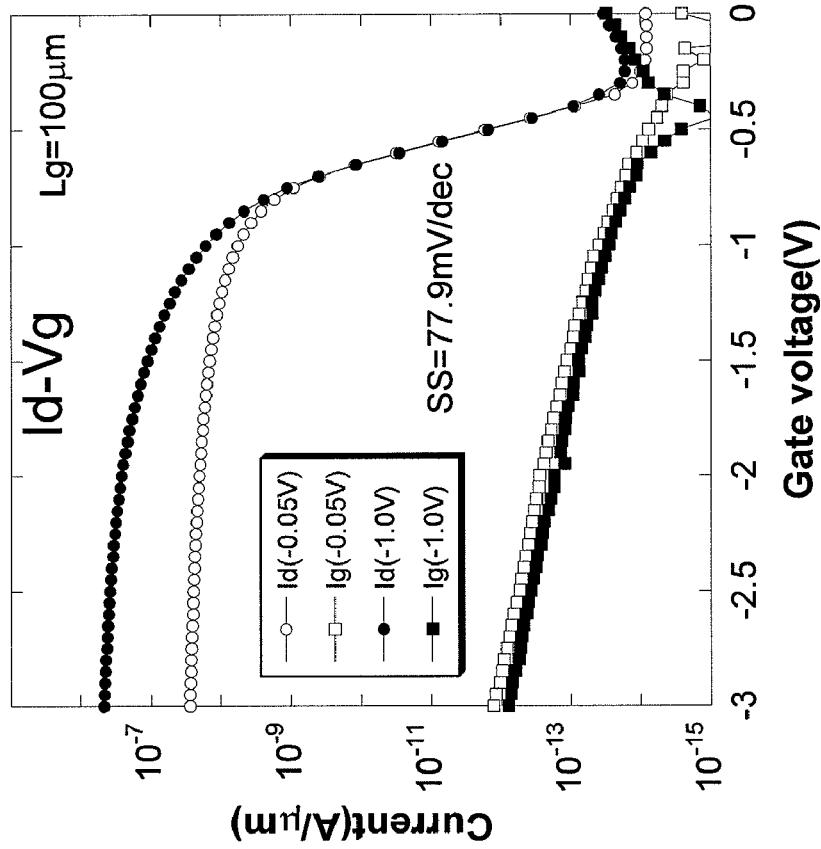

Si PMOS (p-type MOS) transistors using the in-situ boron activated Ge gate electrode are integrated with a radical oxidizing gate oxide and Schottky Pt silicide S/D (source/drain) at temperatures below 350° C. A 8.3 nm gate oxide is formed by using Slot Plane Antenna (SPA) Plasma with 3.4 kW, 2.45 GHz microwave under 50 mTorr, $O_2$/Ar chemistry at 350° C. (TEL Trias). The junctions of PtSi to n-Si are formed at 300° C. and 350° C. Significantly high forward/reverse current ratio of the diodes is successfully obtained in the PtSi/n-Si junction formed at 350° C. FIG. 7 represents (a) $I_d$-$V_g$ curves for a boron doped Ge film for a p-type gate electrode and (b) $I_d$-$V_g$ curves of the Si PMOSFET with 200 nm poly-Ge gate electrode, PtSi S/D and 8.3 nm SPA (slot plane antenna) gate-oxide (350° C.), measured at $V_d$=−0.05 and 1.0V, in which $I_{off}$ of the transistor is reduced below $10^{-14}$ A/μm. Characteristics of Si PMOSFET integrated by combining these low temperature processes show excellent $I_{on}$/$I_{off}$ ratio over $10^7$, low gate leakage and steep $SS_{min}$=77.9 mV/dec.

Figure 8:
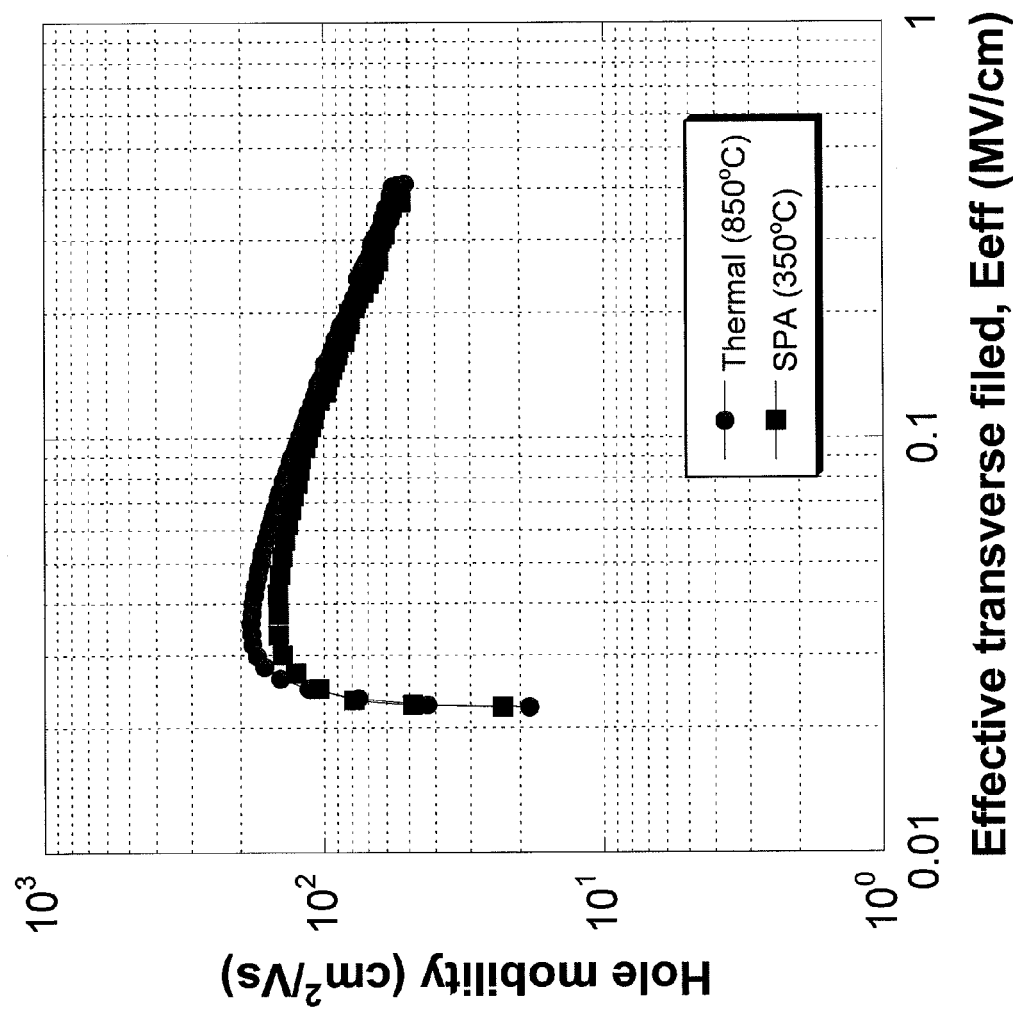
FIG. 8 is the effective mobility as a function of effective transverse filed of a Si transistor with poly-Ge gate electrode, PtSi source/drain and SPA gate oxide (350° C.) or thermal oxide (850° C.).

FIG. 8 represents effective mobility as a function of effective transverse field for the Si transistor with poly-Ge gate electrode, PtSi S/D and SPA gate oxide (350° C.) or thermal oxide (850° C.). From an inversion—capacitance measurement at 1 MHz and the drain current at $V_d$=−0.05V, the estimated hole mobility is ~150 $cm^2$/Vs, which is compatible to a thermally grown oxide at 850° C. These results prove that low temperature growth of Ge film is very useful for transistors formed at temperatures below 350° C.

Fifth Embodiment

Here, we disclose other application of this invention. The low temperature growth technique of the present invention is useful for not only electrical application, but also mechanical application for MEMS. Ge is easily removed by a chemical wet process, so the low temperature growth Ge film can be used as a sacrificial layer for MEMS applications.

This invention is also useful for optical applications. The low temperature growth germanium is useful for optical detectors formed at low temperature.

This invention is also useful for solar cell technology, which is needed for low temperature growth of semiconductor films. This invention successfully contributes to the low temperature formation of the solar cell.

The invention claimed is:

1. A method of forming a semiconductor film on an insulating film formed on a semiconductor or an insulating substrate, wherein a diboran gas or a diboran/silane mixed gas is supplied to a reaction chamber before forming the semiconductor film, wherein the method comprises the following sequential steps:
  (i) establishing temperature of a substrate at a first temperature;
  (ii) supplying the diborane or diboran/silane mixed gas into the reaction chamber;
  (iii) establishing temperature of the substrate at a second temperature without supplying reaction gases into the reaction chamber; and
  (iv) supplying a gas including $GeH_4$ and/or $SiH_4$ into the reaction chamber to form the semiconductor film.

2. The method of forming a semiconductor film as recited in claim 1, wherein the semiconductor film is mainly composed of germanium.

3. The method of forming a semiconductor film as recited in claim 1, wherein the diboran gas or diboran/silane mixed gas are diluted by hydrogen.

4. The method of forming a semiconductor film as recited in claim 1, wherein a product of a time of exposure and a partial pressure of the diboran gas or diboran/silane mixed gas during film formation is more than 20 mTorr·min.

5. The method of forming a semiconductor film as recited in claim 1, wherein the insulating film is formed below 400° C.

6. The method of forming a semiconductor film as recited in claim 1, wherein the first temperature is higher than the second temperature.

7. The method of forming a semiconductor film as recited in claim 1, wherein the first temperature is 350° C.

8. The method of forming a semiconductor film as recited in claim 1, wherein the gas supplied in step (iv) comprises at least one of $PH_3$, $B_2H_6$ or $AsH_3$ mixed with $GeH_4$.

* * * * *